United States Patent [19]

Young

[11] Patent Number: 4,857,764
[45] Date of Patent: Aug. 15, 1989

[54] CURRENT COMPENSATED PRECHARGED BUS

[75] Inventor: William R. Young, Palm Bay, Fla.

[73] Assignee: Harris Corporation, Melbourne, Fla.

[21] Appl. No.: 213,823

[22] Filed: Jun. 30, 1988

[51] Int. Cl.[4] .......................................... H03K 17/14
[52] U.S. Cl. ................................. 307/443; 307/448; 307/451; 307/481; 307/363
[58] Field of Search ............... 307/443, 448, 449, 481, 307/451–453, 491, 362, 363, 297, 310; 365/203

[56] References Cited

U.S. PATENT DOCUMENTS

| 4,045,684 | 8/1977 | Eads et al. ...................... 307/443 X |
| 4,471,240 | 9/1984 | Novosel .......................... 307/449 X |
| 4,498,021 | 2/1985 | Uya .................................. 307/443 |
| 4,570,083 | 2/1986 | Nakaizumi ...................... 307/443 |
| 4,581,548 | 4/1986 | Young ............................. 307/449 |
| 4,598,216 | 7/1986 | Lauffer et al. .................. 307/443 |
| 4,613,772 | 9/1986 | Young ............................. 307/443 |
| 4,618,786 | 10/1986 | Johnson ......................... 307/481 X |
| 4,647,797 | 3/1987 | Sanwo et al. ................... 307/443 |
| 4,700,086 | 10/1987 | Ling et al. ...................... 307/443 |
| 4,763,021 | 8/1988 | Stickel ............................ 307/310 X |
| 4,763,023 | 8/1988 | Spence ........................... 307/481 X |

FOREIGN PATENT DOCUMENTS 0113893 5/1988 Japan .................................. 365/203

Primary Examiner—David Hudspeth
Attorney, Agent, or Firm—Barnes & Thornburg

[57] ABSTRACT

A current compensated precharged bus including tracking circuit as a part of a latch in a pre-charge circuit for maintaining a fixed deactivation voltage level of the latch. The tracking circuit includes an on-tracking circuit connected to the latch for tracking the characteristics of one of the input devices of the logic circuit being activated and an off-tracking circuit connection to the latch for tracking the characteristics of all the input elements of the logic circuit being deactivated. The latch includes a pull-up transistor, and a deactivation element, connected to the bus for sensing the voltage on the bus and generating a latch deactivation signal when the deactivation voltage level of the deactivation device is exceeded.

16 Claims, 1 Drawing Sheet

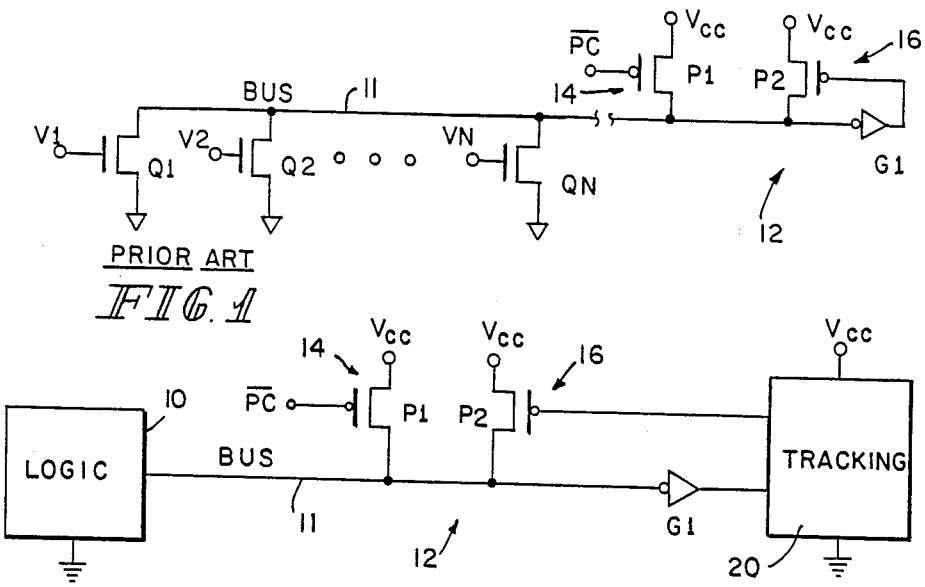
FIG. 1
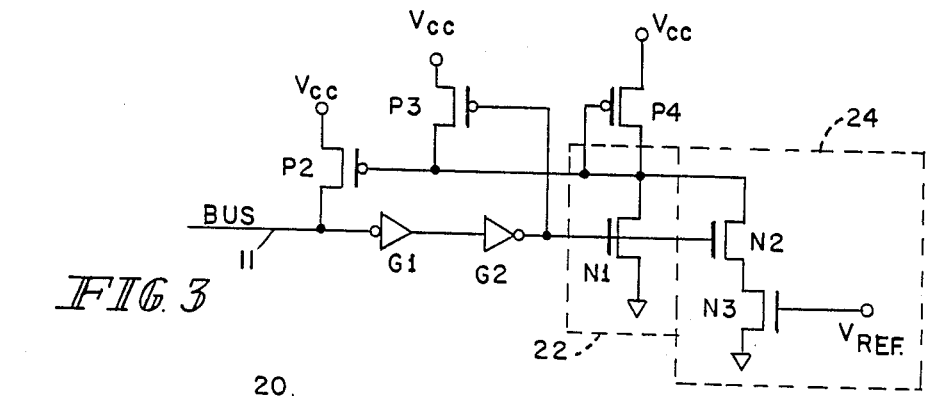
FIG. 2
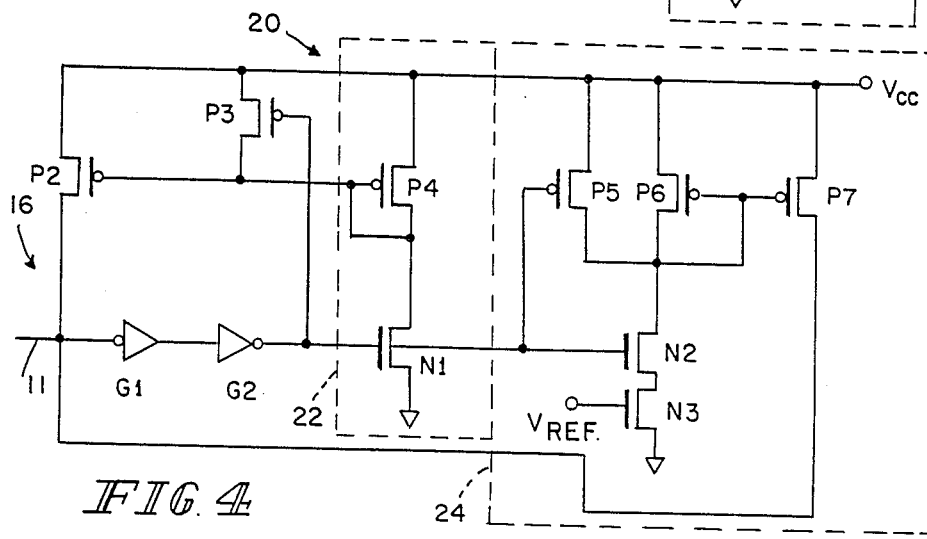
FIG. 3
FIG. 4

CURRENT COMPENSATED PRECHARGED BUS

BACKGROUND AND SUMMARY OF THE INVENTION

Present invention relates generally to pre-charging circuitry and more specifically to a current compensating pre-charge circuit.

Bus lines in memory and other logic circuitry are generally pre-charged to a given value. As illustrated in FIG. 1, a logic 10 including a plurality of parallel devices Q1 through QN is connected between a bus line 11 and a first supply voltage illustrated as ground. A first logic level signal voltage at V1 through VN to any of the transistors Q1 through QN will activate the transistors and pull the bus 11 to the first supply voltage. The pre-charge circuitry 12 includes a pull-up device 14 illustrated as transistor P1 which is activated by a pre-charge signal $\overline{PC}$ to pull up the bus 11 to a second supply voltage Vcc. A latch 16 includes a transistor P2 and an inverter G1 which is responsive to the pre-charge signal on the bus 11 to activate and latch the transistor P2 on, maintaining the bus at the pre-charge value after expiration of the pre-charge signal. Upon actuation of any of logic gates Q1 through QN, the bus 11 is pulled to the first supply voltage and latch 12 is deactivated turning P2 off. The pull-up transistor P1 is typically sized to charge the bus to the second supply voltage source Vcc rapidly, whereas P2 is sized so as to maintain bus 11 above the switching threshold of inverter G1 when all logic gates Q1 through QN are deactivated. Also, any logic gate Q1 through QN, when activated, will pull the bus 11 below the switching threshold of the inverter G1. Pre-charge generally occurs when all parallel logic devices are deactivated by a second logic level signal voltage at V1 through VN to all transistors Q1 through QN.

Under process, temperature, or radiation effects, it may be difficult to establish a large enough size of P2 such that the bus 11 is held above the threshold of inverter G1 when the input devices Q1 through QN are off, and at the same time the size of P2 is small enough that Q1 through QN can individually pull bus 11 below the threshold of value G1 when they are on. For a complete discussion of the effect of currents of logic devices see Young U.S. Pat. No. 4,6613,772. Also typical example of a pre-charge circuitry with latch is illustrated Young U.S. Pat. No. 4,581,548.

Thus it is an object of the present invention to provide a pre-charge circuit which tracks parametric changes in logic devices connected to a common bus.

Another object of the present invention is to provide a more appropriately sized and responsive latch as part of the pre-charge circuit.

A still further object of the present invention is to provide a pre-charge circuit including a latch which compensates for process, temperature and radiation effects.

These and other objects are attained by providing a tracking circuit as a part of a latch in a pre-charge circuit maintaining a fixed deactivation voltage level of the latch. The tracking circuit includes an on-tracking circuit connected to the latch for tracking the characteristics of one of the input devices of the logic circuit being activated and an off-tracking circuit connecting to the latch for tracking the characteristics of all the input elements of the logic circuit being deactivated. The latch includes a pull-up transistor connected to the bus and a deactivation element, which is generally an inverter, connected to the bus for sensing the voltage on the bus and generating a latch deactivation signal when the deactivation voltage level of the deactivation device is exceeded.

The tracking circuit includes a first current mirror having the latch pull-up device as a drive device of the controlled leg and a controlling leg having a drive device interconnected to the second pull-up device. A first load of the controlling leg functioning as the on-tracking device being deactivated by the deactivation signal and having a current capacity of a predetermined ratio to a current capacity of one of the input devices being activated. The off tracking element may be a second load connected in parallel to the first load in the controlling leg of the first current mirror. It is also deactivated by said deactivation signal and has a current capacity of said predetermined ratio to the sum of the current capacity of all input devices being a deactivated. Alternatively, the off-tracking device may be a second current mirror having a controlled leg also connected to the bus. The off-tracking load includes a switch element which is responsive to the deactivation signal in series with a load having the appropriate current characteristics and biased in the same voltage which is used to turn off one of the input devices for the logic gate. A switch is provided for each of the current mirrors connecting the interconnection of the drive devices to the deactivation signal for disabling the current mirrors in response to the deactivation signal.

Other objects, advantages and novel features of the present invention will become apparent from the following detailed description of the invention when considered in conjunction with the accompanying drawings

BRIEF DESCRIPTION OF THE DRAWINGS

FIG. 1 is a schematic of a pre-charge circuit of the prior art.

FIG. 2 is a block diagram for pre-charge including the principles of the present invention.

FIG. 3 is a schematic of a pre-charge circuit incorporating the principles of the present invention.

FIG. 4 is schematic of another pre-charge circuiting incorporating the principles of the present invention.

DETAILED DESCRIPTION OF THE DRAWINGS

As illustrated in FIG. 2, the logic circuit 10 is connected by the bus 11 to the pre-charge circuit 12 which includes the pull-up device 14 which is illustrated as transistor P1 activated by the pre-charge signal $\overline{PC}$ and a latch circuit 16 including a pull-up device P2 and an inverter G1. This is similar to the prior art circuit of FIG. 1. The difference lies in a tracking circuit 20 connected to the latch 16 between the inverter G1 which is a threshold device and the control gate for he pull-up device P2. The tracking circuit 20 tracks the characteristics of the logic circuit 10 to vary the signal on the gate of P2 and therefore maintain a fixed deactivation voltage level for the inverter G1.

As illustrated in FIG. 3, the tracking circuit 20 includes an on-tracking portion 22 and an off-tracking portion 24. The on-tracking portion 22 provides a tracking of the characteristics of one of the logic devices Q1 through QN, the highest "on" resistance device, and represents an N1 transistor proportional to the highest on resistance device of the N type logic devices Q1 through QN. The off-tracking portion 24 includes a transistor N3 having a current capacity proportional to the current capacity of the sum of all the devices Q1 through QN and representing the leakage current of their off state. The on-tracking circuit includes the transistor N1 as the load device for a current mirror including in the controlled leg the pull-up device P2 and in the controlling leg the transistor P4. The on-tracking transistor N1 operates as a load for the controlling leg. The output of the inverter G1 is connected to the gate of N1 through an inverter G2. Once bus 11 is pre-charged high by the pre-charge device, pull-up device 14 or P1, the threshold of G1 and G2 are exceeded and a high signal is provided to the gate of N1. This turns N1 on, providing a load to the control leg P4 of the current mirror.

The ratio of the geometry of P2 to P4 determines the current gain of the current mirror if they are equal geometries and P2 is designed to provide one quarter of the current which is normally sunk by the highest on resistance device of the logic devices Q1 through QN. N1 would also be one quarter of the size of the highest on resistance device of Q1 through QN. Since N1 is the same conductivity type and is made in the same process as Q1 through QN, its characteristics will vary the same as the devices Q1 through QN with respect to fabrication, environment, temperature and radiation. For best tracking N1 would be a unit device and Q1 through QN would then each be four parallel unit devices.

As the on characteristics for one of Q1s through QNs varies on the bus 11, so will the device N1 which is fed back through the current mirror to the gate of P2 to maintain the voltage division between P2 and one of the transistors Q1 through Qn substantially constant. This compensation not provided, the difference in variation of P2 to Q1 through QN will provide a different voltage proportioning between P2 and one of the Q1s through QNs and thus G1 will be driven by a different voltage level A second current component representing the off current is provided by the off-tracking device 24. This includes a transistor N2 having its gate connected to the output of G2 and a series connected N type transistor N3. N3 represents the sum of the leakage currents for the logic transistors Q1 through QN. Thus, N3 could be a single transistor whose width equals the sum of the widths of Q1 through QN or N parallel transistor equal in size to Q1 through QN. The gate of N3 is biased to a reference voltage Vref which represents the voltage level applied to the gate of Q1 through QN in order to turn them off. Thus, N3 represents the sum of the leakage current of all the logic devices Q1 through QN with the appropriate proportioning factor. This value is provided through N2 to the connected gates of P2 and P4 and is in parallel to N1 of the on-tracking circuit.

P3 connects the voltage supply Vcc to interconnected gates of P2 and P4, responsive to the output of G2. When the pre-charge bus 11 is high and the latch is to be actuated, the high signal on the gate of P3 keeps it off. When the latch is deactivated the signal at the output of G2 is low and transistor P3 is on, pulling the interconnected gates up to the voltage Vcc. This turns both the transistors P2 and P4 off and therefore disables the current mirror.

In another embodiment as illustrated in FIG. 4, the on-tracking circuit 22 and the off-tracking circuit 24 are separated using two separate current mirrors The off-tracking circuit includes the switching transistor N2 and the load transistor N3 as loads to a control leg having a driving transistor P6 with its gates interconnected to the driving transistor P7 of the controlled leg. The output of P7 is connected to the bus line 11 in parallel to the controlled leg P2 of the first current mirror. The current mirror of the off-tracking circuit 24 also includes a switch P5 connected between Vcc and the interconnected gates of the drive device P6 and controlled device P7. Switch P5 is activated upon the input the bus 11 and the output of G2 being low deactivating the latch. When P5 is activated, transistors P6 and P7 are switched off.

By providing the on-tracking and the off-tracking circuits 22 and 24 respectively in FIG. 4, the ratioing of device sizes may be easier to achieve and lead to lower power dissipation. The circuit dissipates power when the pre-charged bus 11 is high, Vcc. The power is caused by the current flowing through P4 and N1 and the current flowing through P6, N2 and N3. By making the current gain ratio of P2 to P4 or P7 to P6 greater than 1, the power dissipation can be reduced. When the pre-charged bus 11 goes low, ground, N1 and N2 are turned off by the output of G2 going low. P3 and P5 are turned on by G2 going low. P3 and P5 turning on turns on P2 and P4 and P6 and P7 off respectively. Hence no power except that due to leakage current is dissipated in the circuit. The off-tracking circuit may be deleted, if the off current or the leakage current, is not significant.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A precharge circuit for a bus having a plurality of input means connected in parallel between said bus and a first voltage source for creating a first output logic voltage on said bus if any one of said input means is activated in response to a first input logic signal at its input, said precharge circuit comprising:

Pull means connected between said bus and a second voltage source for creating a second output logic voltage on said bus in response to a precharge signal at an input to said pull means;

a latch means connected between said bus and said second voltage source for maintaining said bus at said second output logic voltage until voltage produced by activation of one of said input means on said bus exceeds a deactivation voltage level of said latch means; and tracking means connected to said latch means for maintaining a fixed deactivation voltage level of said latch means.

2. A precharge circuit according to claim 1, wherein said tracking means includes:

on-tracking means connected to said latch means for tracking the characteristics of one of said activated input means; and off-tracking means connected to said latch means for tracking the characteristics of all of said input means, when all of said input means are deactivated.

3. A precharge circuit according to claim 2, wherein:

said latch means includes a second pull means connected between said bus and said second voltage source for maintaining said second output logic voltage on said bus when activated, and deactivation means connected to said bus for sensing voltage on said bus and generating a latch deactivation signal when said deactivation voltage level is exceeded;

said on-tracking means includes a first current mirror having said second pull means as a drive device of a controlled leg and a controlling leg having a drive device interconnected to said second pull means, a first load means of said controlling leg being deactivated by said deactivation signal and said on-tracking means having current capacity of a predetermined ratio to a current capacity of one of said activated input means.

4. A precharge circuit according to claim 3, wherein said off-tracking means includes a second load means in said controlling leg and parallel to the load means of said first current mirror, said load means of said off-tracking means is deactivated by said deactivation signal and said off-tracking means having a current capacity of said predetermined ratio to the sum of the current capacity of all of said input means, when all of said input means are deactivated.

5. A precharge circuit according to claim 4, wherein said second load means includes a switch means responsive to said deactivation signal, and a series load of said described current capacity and reference means for supplying to said series load a reference voltage equal to a second input logic signal.

6. A precharge circuit according to claim 3, wherein said off-tracking means includes a second current mirror having a controlled leg connected to said bus and controlling leg with interconnected drive devices, a second load means of said controlling leg of said off-tracking means is deactivated by said deactivation signal and having a current capacity of said Predetermined ratio to the sum of the current capacity of all of said input means, when all of said input means are deactivated.

7. A precharge circuit according to claim 6, wherein said second load means includes a switch means responsive to said deactivation signal, and a series load of said described current capacity and reference means for supplying to said series load a reference voltage equal to a second input logic signal.

8. A precharge circuit according to claim 6, including first and second switch means connected between said second voltage source and said drive devices of a respective current mirror for disabling said first and second current mirrors in response to said deactivation signal.

9. A precharge circuit according to claim 3, including switch means connected between said second voltage source and said drive devices of said current mirror for disabling said first current mirror in response to said deactivation signal.

10. A precharge circuit according to claim 1, wherein:

said latch means includes a second pull means connected between said bus and said second voltage source for maintaining said second output logic voltage on said bus when activated, and deactivation means connected to said bus for sensing voltage on said bus and generating a latch deactivation signal when said deactivation voltage level is exceeded;

said tracking means includes a first current mirror having said second pull means as a drive device of a controlled leg and a controlling leg having a drive device interconnected to said second pull means, a first load means of said controlling leg being deactivated by said deactivation signal and said tracking means having current capacity of a predetermined ratio to a current capacity of one of said activated input means.

11. A precharge circuit according to claim 10, wherein said tracking means includes a second load means in said controlling leg and parallel to the load means of said first current mirror, said load means of said tracking means is deactivated by said deactivation signal and said tracking means having a current capacity of said predetermined ratio to the sum of the current capacity of all of said input means, when all of said input means are deactivated.

12. A precharge circuit according to claim 11, wherein said second load means includes a switch means responsive to said deactivation signal, and a series load of said described current capacity and reference means for supplying to said series load a reference voltage equal to a second input logic signal.

13. A precharge circuit according to claim 10, wherein said off-tracking means includes a second current mirror having a controlled leg connected to said bus and controlling leg with interconnected drive devices, a second load means of said controlling leg of said off-tracking means is deactivated by said deactivation signal and having a current capacity of said predetermined ratio to the sum of the current capacity of all of said input means, when all of said input means are deactivated.

14. A precharge circuit according to claim 13, wherein said second load means includes a switch means responsive to said deactivation signal, and a series load of said described current capacity and reference means for supplying to said series load a reference voltage equal to a second input logic signal.

15. A precharge circuit according to claim 13, including first and second switch means connected between said second voltage source and said drive devices of a respective current mirror for disabling said first and second current mirrors in response to said deactivation signal.

16. A precharge circuit according to claim 10, including switch means connected between said second voltage source and said drive devices of said current mirror for disabling said first current mirror in response to said deactivation signal.

* * * * *